United States Patent
Gao et al.

(10) Patent No.: US 10,381,826 B2
(45) Date of Patent: Aug. 13, 2019

(54) INTEGRATED CIRCUIT ELECTROSTATIC DISCHARGE PROTECTION

(71) Applicant: Globalfoundries Singapore Pte. Ltd., Singapore (SG)

(72) Inventors: Wei Gao, Singapore (SG); Manjunatha Prabhu, Singapore (SG); Tsung-Che Tsai, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 344 days.

(21) Appl. No.: 15/135,585

(22) Filed: Apr. 22, 2016

(65) Prior Publication Data

US 2017/0310103 A1    Oct. 26, 2017

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC . H02H 9/046; H01L 27/0255; H01L 27/0266; H01L 27/0292
USPC .......................................................... 361/56
See application file for complete search history.

(56) References Cited

U.S. PATENT DOCUMENTS

| | | | |
|---|---|---|---|
| 7,911,748 B1* | 3/2011 | Chu ................... | H01L 27/0266 361/11 |
| 2002/0154463 A1* | 10/2002 | Mergens ............. | H01L 27/0251 361/56 |
| 2010/0302693 A1* | 12/2010 | Hayashi .............. | H01L 27/0251 361/56 |
| 2011/0075305 A1* | 3/2011 | Kilroy ...................... | H02H 3/22 361/56 |

\* cited by examiner

*Primary Examiner* — Kevin J Comber
(74) *Attorney, Agent, or Firm* — Lorenz & Kopf, LLP

(57) ABSTRACT

Integrated circuits with electrostatic discharge (ESD) protection and methods of providing ESD protection in an integrated circuit are provided. An ESD protection circuit the ESD protection circuit may incorporate a transistor, such as a MOSFET, and a voltage limiter coupled to a gate of the transistor. The voltage limiter may be configured such that with an ESD disturbance on the voltage supply rail, Vdd, a gate voltage of the transistor of the ESD protection circuit is held below the supply voltage (Vdd) inducing base current, Isub, within the transistor to effectively shunt a current arising from the ESD event from the voltage supply rail Vdd to the voltage supply rail Vss.

8 Claims, 2 Drawing Sheets

INTEGRATED CIRCUIT ELECTROSTATIC DISCHARGE PROTECTION

TECHNICAL FIELD

The technical field generally relates to integrated circuits with electrostatic discharge protection and methods of providing electrostatic discharge protection in integrated circuits, and in particular, the technical field relates to trigger circuits and methods for electrostatic discharge protection circuits.

BACKGROUND

Electrostatic discharge (ESD) has been around since the beginning of time. It is the sudden flow of electricity between two electrically charged objects caused by contact, an electrical short, or dielectric breakdown. However, this natural phenomenon has only become an issue with the widespread use of semi-conductor based integrated circuits and electronics.

All materials (insulators and conductors alike) are sources of ESD. These materials are lumped together in what is known as the triboelectric series, which defines the materials associated with positive or negative charges. Positive charges accumulate predominantly on human skin or animal fur. Negative charges are more common to synthetic materials such as plastics. The amount of electrostatic charge that can accumulate on any item, whether that charge be positive or negative, is dependent on the material and its capacity to store a charge.

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate dielectric is disposed between the gate electrode and the semiconductor substrate to electrically isolate the gate electrode from the substrate. A control voltage applied to the gate electrode controls the flow of current through a channel in the substrate underlying the gate electrode between the source and drain regions.

An integrated circuit may be subjected to an electrostatic discharge (ESD) event during the manufacturing process, assembly handling and in the ultimate system application. The energy associated with this transient discharge can easily damage the fragile devices present within the integrated circuit (IC).

In the processing and handling of integrated circuits, ESD may originate from any number of sources such as a mechanical chip carrier, a plastic chip storage device, or even human interaction with the process. In each case it is possible that the integrated circuit is subjected to a voltage that is many times greater than its design voltage. The human body, for example, can store a charge equal to 250 picofarads. This correlates into a stored charge that can be as high as 25,000V. For integrated circuits that operate at voltages of less than, for example, 5V (volts), an electrostatic discharge on the order of several thousand volts can be devastating.

External pins or pads form the connection points for the integrated circuit to the outside world and therefore also serve as pathways for ESD events. An ESD event applied to a pad may couple the ESD voltage exceeding several thousand volts to circuitry coupled to the pad. Therefore, the coupling of ESD to the external pins is also of particular concern to the IC package and circuit designer.

In one conventional IC ESD protection scheme, often referred to as a dynamic trigger scheme, special clamp circuits are often used to shunt ESD current between the IC power supply rails and thereby protect internal elements from damage. A type of ESD protection circuit, known as an active metal oxide semiconductor field effect transistor (MOSFET) clamp circuit, typically consists of three functional elements: an RC detector or trigger circuit, several stages of inverters and a large MOSFET transistor. The detector circuit is designed to respond to an applied ESD event but remain inactive during normal operation of the IC. The inverter stages are used to amplify the detector circuit output in order to drive the gate terminal of the large MOSFET transistor. The large MOSFET transistor, connected between the two power supply rails, acts as the primary ESD current dissipation device in the clamp circuit. Active MOSFET clamp circuits typically rely on only MOSFET action to shunt ESD current between the rails. Since the peak current in an ESD event may be on the order of amperes, very large MOSFET transistor sizes are required. Generally speaking, these arrangements are limited to ICs of two-rail constructions, e.g., Vdd and Vss rails, wherein all the gates are or should be driven to full Vdd potential.

In this typical arrangement of an RC clamp, ESD protection circuit, the large MOSFET is operated in "surface mode." As a result, the MOSFET operates with very low current efficiency, which is generally limited by its drain saturation current ($I_{dsat}$). The turn-on curve is theoretically following the on resistance, Ron=1/gm linear trend, where gm is the MOSFET transconductance. Because of the limitation of the MOSFET to operate efficiently, and it being difficult to obtain improvements in how large the $I_{dsat}$ can be made, the MOSFET must be made exceptionally large to address the anticipated ESD event. This makes positioning of the MOSFET within the IC difficult, among other things. Alternatively, circuitry may be introduced to boost MOSFET efficiency by boosting the gate voltage to be very much greater than the drain voltage ($V_g \gg V_d$). This circuit requires additional chip space.

Accordingly, it is desirable to provide ESD protection in an integrated circuit with good current efficiency, and to introduce methods of providing ESD protection with good MOSFET current efficiency. In addition, it is desirable to provide integrated circuits with a reduced size MOSFET in an ESD protection circuit by improving MOSFET current efficiency. Furthermore, other desirable features and characteristics of the present embodiment will become apparent from the subsequent detailed description and the appended claims, taken in conjunction with the accompanying drawings and this background.

BRIEF SUMMARY

Integrated circuits with electrostatic discharge (ESD) protection and methods of providing ESD protection in an integrated circuit are provided. In an exemplary embodiment, an ESD protection circuit the ESD protection circuit incorporates a transistor, such as a MOSFET, and a voltage limiter coupled to a gate of the clamp transistor. The voltage limiter may be configured such that with an ESD disturbance on the voltage supply rail, Vdd, a gate voltage of the transistor of the ESD protection circuit is held below the supply voltage (Vdd) inducing base current, Isub, within the transistor to effectively shunt a current arising from the ESD event from the voltage supply rail Vdd to the voltage supply rail Vss.

In accordance with further herein described embodiments, a method of limiting an ESD event within an integrated circuit includes limiting a gate turn on voltage of a clamp transistor of an ESD protection circuit during the ESD event.

In accordance with further herein described embodiments, a method of limiting an ESD event within an integrated circuit includes inducing a parasitic current within a clamp transistor.

Advantageously, ESD protection circuit structures and methods of providing ESD protection in integrated circuits in accordance with herein described embodiments may be achieved without fabrication process changes, but can be implemented as design methodologies.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits, and methods for configuring and operating the same. The various structures, elements, tasks and steps described herein may be incorporated into a more comprehensive structure, procedure or process having additional elements, steps or functionality not described in detail herein. In particular, many structures, designs and methods of producing integrated circuits are well-known and so, in the interest of brevity, many conventional aspects of IC will only be mentioned briefly herein or will be omitted entirely without providing the well-known details.

Figure 1:
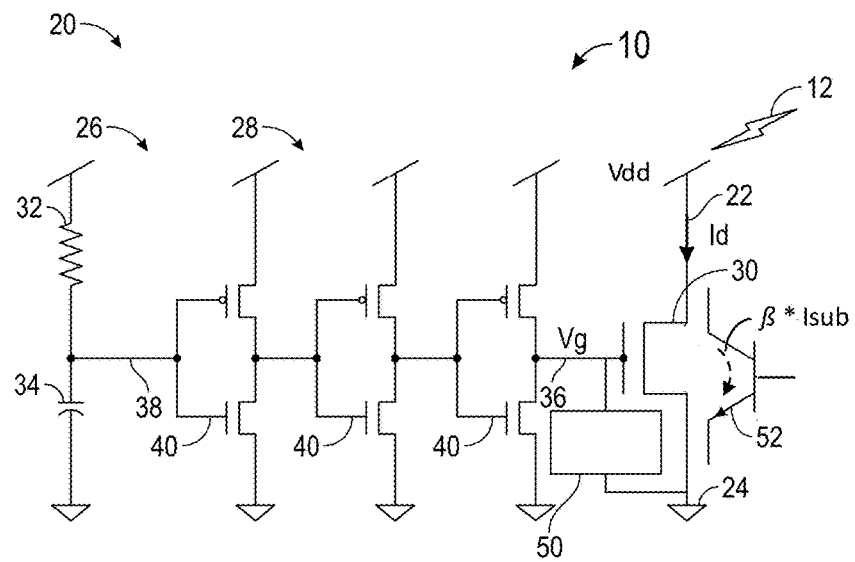
FIG. 1 is a schematic circuit diagram of an integrated circuit with an electrostatic discharge protection circuit in accordance with herein described embodiments.

Referring to the exemplary embodiment depicted in FIG. 1, an integrated circuit 10 includes an ESD event triggered ESD protection circuit 20. The ESD protection circuit 20 protects a Vdd power supply rail 22 from a positive ESD event, graphically depicted in FIG. 1 as ESD event 12, referenced to grounded Vss power supply rail 24. ESD protection circuit 20 includes a trigger circuit 26, a buffer circuit 28 and a N-channel MOSFET clamp transistor 30.

The trigger circuit 26 is designed as a resistor-capacitor (RC) transient detector, utilizing a resistive element, shown as resistor 32 and a capacitive element, shown as capacitor 34. It will be appreciated that implementations of ESD protection circuit 20 may use virtually any suitable resistive and capacitive structures to form trigger circuit 26, and designing and forming resistive and capacitive structures within an integrated circuit is well within the ability of the person of ordinary skill in the art.

The buffer circuit 28 drives the gate 36 of the transistor 30 relative to a voltage at node 38 of the trigger circuit 26. As shown, the buffer circuit 28 may include one, but typically more than one inverter 40, and as illustrated in FIG. 1, in one implementation the buffer circuit incorporates three (3) operatively coupled inverters 40.

ESD events such as ESD event 12 typically occur during off-chip handling and processing when the circuit incorporating the IC 10 is generally not assembled. In response to the ESD event 12 inducing a rapid positive voltage increase on the Vdd rail 22, trigger circuit 26 initially holds the node 38 around zero voltage. The buffer circuit 28, with an input connected to node 38, then attempts to drive the gate 36 of transistor 30 to the voltage of Vdd rail 22 in order to turn on the transistor 30, i.e., $Vg\sim=Vdd$. It is noted that as used herein Vdd denotes the voltage of Vdd rail 22, which during an ESD event may denote a voltage of the ESD protection clamp voltage level of the Vdd rail 22. This value of Vdd may not necessarily be equal to the regular or normal operating voltage of the IC 10, which also during normal operating mode is generally referred to as Vdd.

Figure 3:
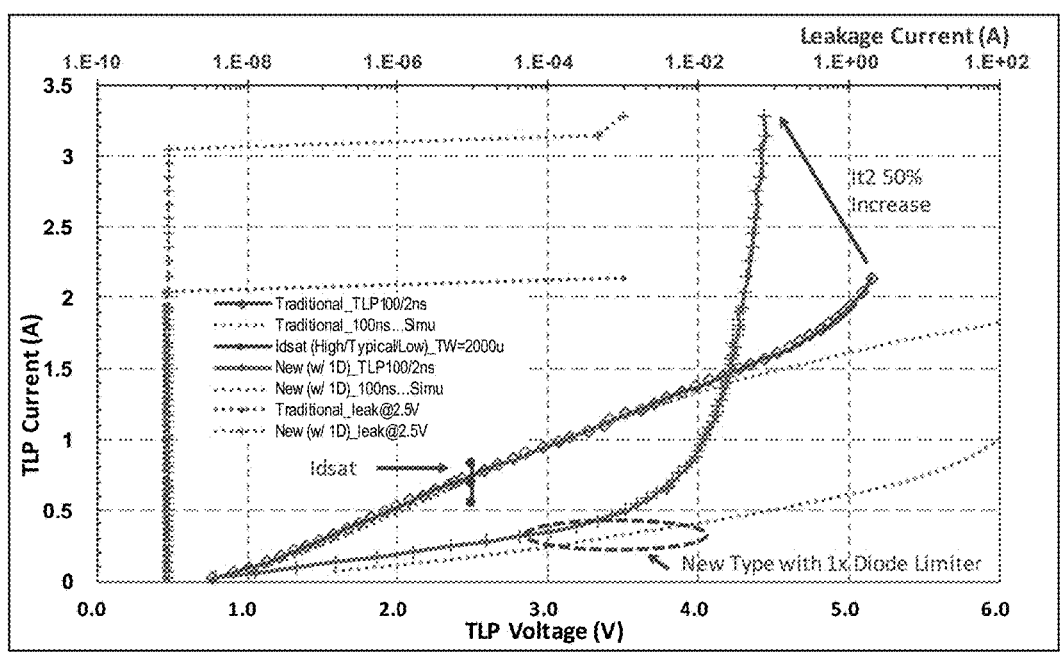
FIG. 3 graphically depicts performance of an electrostatic discharge protection circuit in accordance with the herein described embodiments.

Further shown in FIG. 3 a voltage limiter 50 is coupled from the gate 36 to the transistor source, which is also coupled to and held at the grounded Vss rail 24 potential. The voltage limiter 50 is configured to limit the gate voltage (Vg) to a value less than Vdd as described below.

When configured as a nMOSFET, the transistor 30 has a drain-body-source parasitic bipolar transistor component illustrated for discussion purposes in FIG. 1 as transistor 52 which conducts the parasitic current, Isub. In contrast, a pMOSFET would have a PNP transistor. Although this parasitic current conducting transistor effect must be prevented for normal MOSFET operation, in accordance with the herein described embodiments, this otherwise parasitic effect may be utilized during ESD events.

As the voltage rise on Vdd rail 22 continues in response to the ESD event, the drain voltage increases so that impact ionization (II) begins to occur within the drain-body-source parasitic bipolar transistor 52, which creates the so called parasitic current, Isub, flowing into the substrate. However, it is commonly known that baseline MOSFETS have a peak value of Isub at a certain gate bias (Vg), not too low, not too high, and a typical value is around $Vg=1\sim 2V$. The gate voltage limiter 50 is here configured to limit the gate voltage such that the induced current, Isub, is maximized.

Generally speaking, the current amplifying factor beta ($\beta$) of the transistor 52 is not very high, for example the amplifying value may be from about 1 to about 10. A parasitic PNP has an even lower amplifying factor $\beta$. The above-mentioned Isub forms as a base current and is amplified as $\beta*Isub$, which is sufficient for the transistor 30 to discharge ESD current from Vdd rail 22 to Vss rail 24.

For a given transistor construction and manufacturing process, the gate voltage value to achieve peak Isub will vary. Ideally, the gate voltage limiter is selected to achieve peak Isub. The value of gate voltage to achieve peak Isub for any given transistor construction is well characterized and known to the designer. Generally speaking, in an embodiment wherein Vdd is at or held at $\sim=2.5V$, the voltage limiter may be configured to hold the gate voltage, Vg, to half or less than Vdd. Still further, the voltage limiter may be configured to limit the gate voltage, Vg, to approximately 1V, i.e., $Vg\sim=1V$. In any event, the value of the gate voltage, Vg, will be selected to maximize the value of Isub.

Once the current Isub is induced within the transistor 52, the transistor 30 acts as a low resistance shunt between the Vdd rail 22 and the Vss rail 24. Transistor 30 will remain in this state for a period of time, which is determined by the RC time constant of trigger circuit 26. As a result, this RC time constant should be set long enough to exceed the maximum expected duration of an ESD event, typically three to five hundred nanoseconds, while short enough to avoid false triggering of the protection circuit 20 during normal ramp-up of the Vdd rail 22. This Vdd ramp-up during normal operation typically requires two to five milliseconds. Note that once Vdd reaches a constant power supply level as is associated with normal operation, transistor 30 is biased in a nonconductive state as is required for normal operation.

Figure 2:
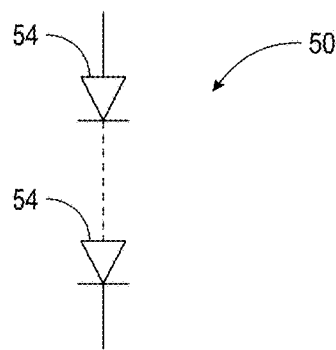
FIG. 2 is a schematic circuit diagram of a voltage limiter that may be used in the ESD protection circuit shown in FIG. 1.

The voltage limiter 50 may be of any suitable construction. A possible embodiment is shown in FIG. 2 as a stack of N diodes 54. As shown in FIG. 2, the voltage limiter 50 is formed by two (2) diodes 54. It should be appreciated that any suitable number of diodes may be used, and generally, the voltage limiter 50 may be constructed of Nx diodes, where x is a non-zero, positive integer, in order to achieve approximately the desired gate clamp voltage. As is known to the designer, transistor stacks, diode stacks, and other such structures having known, fixed voltage clamping characteristics may be used.

With the configuration of the voltage limiter 50 depicted in FIG. 2, the gate voltage Vg~=N*Vdio, where Vdio is the single diode voltage drop and N is the number of diodes, for example. Using two (2) diodes provides a gate clamp voltage of Vg~=1V, which for the embodiments shown here approximately maximizes the induced current, Isub, in the transistor 30.

FIG. 3 illustrates the effectiveness of an electrostatic discharge protection circuit, such as circuit 20, in accordance with the herein described embodiments. FIG. 3 plots transmission line pulse (TLP) test data for an ESD protection circuit of traditional construction in comparison to an ESD protection circuit in accordance with one or more of the herein described embodiments. In particular, data is shown in FIG. 3 for an ESD protection circuit in accordance with an embodiment in which a single diode voltage limiter, limiter 50, is applied to the gate of the ESD protection clamp transistor, transistor 30. The TLP test and resulting data are otherwise standard.

Illustrated in FIG. 3 along the Y and X axes are TLP current in amperes (A) and TLP voltage in volts (V), respectively. The upper X axis provides leakage current in amperes (A). The TLP test depicts actual test data using a pulse width of 100 ns and a rise of time of 2 ns, referenced as 100/2 ns, and simulation data of the same conditions, referenced as 100_Simu. ESD protection transistor, e.g., transistor 30, Idsat is shown in high, typical and low ampere (A) values. Leakage current, referenced to the upper X axis, is shown sampled at 2.5V. And, It2, the second breakdown current, which indicates when the device has failed, is illustrated for both the traditional ESD protection circuit and the ESD protection circuit in accordance with the herein described embodiments.

As is readily apparent from the data depicted is the marked improvement in It2 provided by ESD protection circuits as herein described over traditional constructions. The data depicted in FIG. 3 supports a conclusion that the herein described ESD protection circuits provide up to 50 percent better It2 performance. Further illustrated in FIG. 3 is the improvement in ESD current conduction before leakage breakdown, as shown by the comparison of leakage current for the traditional ESD protection circuit and the ESD protection circuit in accordance with the herein described embodiments.

As disclosed and described herein, improvement in ESD protection may be obtained notwithstanding the limitations on MOSFET size and turn on capability of traditional ESD protection circuits. Advantageously, the parasitic current conducting transistor effect of the MOSFET is leveraged to improve ESD current conduction. This transistor affect is induced by limiting the turn on gate voltage of the MOSFET and taking advantage of the induced current Isub and transistor amplifier effect B. In an ESD circuit, a voltage limiter may be coupled between the gate and the source of the MOSFET, where the voltage limiter is configured to limit the gate voltage to a predetermined value selected to maximize Isub within the MOSFET.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit electrostatic discharge protection circuit comprising:
    a transistor having a drain operatively coupled to a first rail of the integrated circuit and a source operatively coupled to a second rail of the integrated circuit;
    a trigger circuit operatively coupled to drive a gate of the transistor in response to an ESD event occurring on one of the first and second rails, wherein
    the trigger circuit includes a voltage limiter operatively coupled from the gate to the source of the transistor the voltage limiter selectively limiting the gate voltage to a voltage less than a full turn on voltage of the transistor, wherein the gate voltage is selected to maximize a parasitic current flow within a parasitic bipolar transistor component of the transistor responsive to the ESD event.

2. The integrated circuit of claim 1, wherein the first rail has a voltage, Vdd, wherein Vdd is equal to 2.5 volts (V), and the voltage limiter is configured to limit the voltage to the gate to 1V or less.

3. The integrated circuit of claim 1, wherein the voltage limiter is configured to limit the voltage to the gate such that the transistor is not fully turned on.

4. The integrated circuit of claim 1, wherein the voltage limiter comprises a diode.

5. The integrated circuit of claim 1, wherein the voltage limiter comprises a plurality of diodes arranged in series.

6. A method providing electrostatic discharge protection in an integrated circuit comprising:
    disposing a transistor coupled between a first rail and a second rail of the integrated circuit; and
    inducing a parasitic current within the transistor responsive to an ESD event occurring on one of the first and second rails by limiting a gate turn on voltage to the transistor to a voltage selected to maximize the parasitic current, wherein inducing a parasitic current within the transistor comprises limiting a turn on voltage applied to a gate of the transistor to less than a full turn on voltage for the transistor.

7. The method of claim 6, wherein the first rail has a voltage, Vdd, wherein Vdd is 2.5 volts (V), and the method comprises limiting the turn on voltage to 1V or less.

8. A method of providing electrostatic discharge (ESD) protection in an integrated circuit, the integrated circuit including a transistor coupled between a first rail and a second rail of the integrated circuit, the method comprising:
   providing a voltage limited gate turn-on voltage to a gate of the transistor responsive to an ESD events, and
   inducing a maximized parasitic current between the first rail and the second rail within a parasitic bipolar transistor component of the transistor, wherein providing the voltage limited gate turn-on voltage to the gate comprises limiting a turn on voltage applied to the gate to less than a full turn on voltage for the transistor.

* * * * *